US011627676B2

United States Patent
Tong

(10) Patent No.: US 11,627,676 B2
(45) Date of Patent: Apr. 11, 2023

(54) SUPPORT FRAME FOR BENDABLE DISPLAY SCREEN, AND BENDABLE DISPLAY SCREEN

(71) Applicant: Beijing Xiaomi Mobile Software Co., Ltd., Beijing (CN)

(72) Inventor: Guowen Tong, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 213 days.

(21) Appl. No.: 17/147,843

(22) Filed: Jan. 13, 2021

(65) Prior Publication Data

US 2021/0368640 A1 Nov. 25, 2021

(30) Foreign Application Priority Data

May 22, 2020 (CN) .......................... 202010443671.0

(51) Int. Cl.
| | | |
|---|---|---|
| *H05K 5/02* | (2006.01) | |
| *G06F 1/16* | (2006.01) | |
| *H05K 5/00* | (2006.01) | |
| *H04M 1/02* | (2006.01) | |
| *H04B 1/3827* | (2015.01) | |

(52) U.S. Cl.
CPC ......... *H05K 5/0226* (2013.01); *G06F 1/1652* (2013.01); *H04M 1/0268* (2013.01); *H05K 5/0017* (2013.01); *H04B 1/3827* (2013.01)

(58) Field of Classification Search
CPC .... G06F 1/1652; G06F 1/1681; H05K 5/0226
See application file for complete search history.

(56) References Cited

U.S. PATENT DOCUMENTS

| | | | | |
|---|---|---|---|---|
| 9,337,434 | B2* | 5/2016 | Lindblad | G06F 3/0362 |
| 9,348,450 | B1* | 5/2016 | Kim | G06F 3/0412 |
| 9,615,473 | B2* | 4/2017 | Kim | H05K 1/028 |
| 9,733,668 | B2* | 8/2017 | Park | H04B 1/385 |
| 10,070,546 | B1* | 9/2018 | Hsu | H04M 1/0268 |
| 10,117,346 | B2* | 10/2018 | Yang | G06F 1/163 |

(Continued)

FOREIGN PATENT DOCUMENTS

| | | |
|---|---|---|
| CN | 110554733 A | 10/2019 |
| EP | 3056963 A1 | 8/2016 |

(Continued)

OTHER PUBLICATIONS

Notice of Reasons for Refusal for Japanese Application No. 2020-173147, dated May 6, 2022.

(Continued)

*Primary Examiner* — Rockshana D Chowdhury
*Assistant Examiner* — Douglas R Burtner
(74) *Attorney, Agent, or Firm* — Finnegan, Henderson, Farabow, Garrett & Dunner, L.L.P.

(57) ABSTRACT

A support frame for a bendable display screen includes: a fixed part; a bendable part connected with the fixed part; and an end part arranged at an end of the support frame. The bendable part includes a first bendable part and a second bendable part. The first bendable part includes a plurality of first frame members connected with one another, and the plurality of first frame members have a gap therebetween. The second bendable part is connected with the end part. Both the end part and the fixed part are provided with a limiting member.

14 Claims, 5 Drawing Sheets

(56) References Cited

U.S. PATENT DOCUMENTS

| | | | | |
|---|---|---|---|---|
| 10,120,421 B1* | 11/2018 | Hong | ..................... | G06F 1/1681 |
| 10,209,743 B1* | 2/2019 | Hsu | ..................... | G06F 1/1681 |
| 10,365,691 B2* | 7/2019 | Bae | ..................... | G06F 1/1652 |
| 10,520,992 B1* | 12/2019 | Chang | ..................... | H05K 5/0226 |
| 11,459,808 B2* | 10/2022 | Wu | ..................... | A44C 5/0015 |
| 11,582,876 B2* | 2/2023 | Ko | ..................... | H05K 5/0017 |
| 2015/0089974 A1* | 4/2015 | Seo | ..................... | A44C 5/0076 63/1.13 |
| 2015/0131222 A1* | 5/2015 | Kauhaniemi | ......... | H05K 5/0226 16/225 |
| 2016/0014919 A1* | 1/2016 | Huitema | ................ | G04G 17/08 313/511 |
| 2016/0006241 A1 | 3/2016 | Ko et al. | | |
| 2016/0062410 A1* | 3/2016 | Ko | ..................... | G06F 1/1681 361/679.03 |
| 2016/0327987 A1* | 11/2016 | Huitema | ............... | G04G 17/045 |
| 2017/0359915 A1* | 12/2017 | Yang | ..................... | G06F 1/163 |
| 2018/0092223 A1* | 3/2018 | Hsu | ..................... | H04M 1/0216 |
| 2018/0317333 A1* | 11/2018 | Bi | ..................... | E05D 3/06 |
| 2019/0034143 A1* | 1/2019 | Wu | ..................... | G06F 3/14 |
| 2019/0050023 A1* | 2/2019 | Wu | ..................... | A44C 5/0061 |
| 2019/0132974 A1* | 5/2019 | Chen | ..................... | G06F 1/1652 |
| 2020/0137907 A1* | 4/2020 | Kang | ..................... | H05K 5/0017 |
| 2020/0233466 A1* | 7/2020 | Sanchez | ............... | H05K 5/0017 |
| 2021/0011514 A1* | 1/2021 | Wang | ..................... | G06F 1/1652 |
| 2021/0307185 A1* | 9/2021 | Hong | ..................... | H05K 5/0226 |
| 2021/0307186 A1* | 9/2021 | Hong | ..................... | H05K 5/0226 |
| 2022/0256020 A1* | 8/2022 | Liu | ..................... | H04M 1/0268 |

FOREIGN PATENT DOCUMENTS

| | | |
|---|---|---|
| JP | 2015/228022 A | 12/2015 |
| JP | 2018/506327 A | 3/2018 |
| JP | 2018506327 A | 3/2018 |
| KR | 2015/0026082 A | 3/2015 |

OTHER PUBLICATIONS

Extended European Search Report in Application No. 21155779.8, dated Jul. 16, 2021.

Notice of Reasons for Refusal for Japanese Application No. 2020-173147, dated Nov. 12, 2021.

Examination Report of Indian Application No. 202044056737, dated Jan. 4, 2022.

Notification of Reason for Refusal for Korean Application No. 10-2020-0122119, dated Oct. 28, 2021.

* cited by examiner

SUPPORT FRAME FOR BENDABLE DISPLAY SCREEN, AND BENDABLE DISPLAY SCREEN

CROSS-REFERENCE TO RELATED APPLICATION

This application is based on and claims priority to Chinese Patent Application No. 202010443671.0, filed on May 22, 2020, the entire content of which is incorporated herein by reference.

TECHNICAL FIELD

The present disclosure relates to the field of display, and more particularly to a support frame for a bendable display screen, and a bendable display screen.

BACKGROUND

With the rapid development of communication technology, a mobile terminal, such as a mobile phone, is used more and more widely, and requirements for a large display screen increase. Although the enlargement of the display screen brings a great visual experience, it may be inconvenient for a user to carry the mobile terminal.

On the other hand, a wearable intelligent terminal, such as an intelligent bracelet or an intelligent watch, has developed rapidly in recent years. However, limited by issues such as a small display screen and a relatively short battery life, the wearable intelligent terminal has fewer functions and a limited range of use. Therefore, a bendable intelligent terminal emerges as the times require.

An existing bendable intelligent terminal mainly adopts a rotating bearing to connect support structures on both sides, so as to achieve the bending, and the adopted structure of the supporting and rotating shaft is a sheet solid structure. However, such sheet structure is only able to achieve a local bending of a small area, cannot achieve an integrated design of a rigid support and a flexible deformation of an overall machine, and thus cannot be applied to a wearable device.

Since the structure of the supporting and rotating shaft occupies a relatively large space, an available internal space of the bendable mobile terminal is reduced accordingly, thus limiting a size of a functional module such as a display screen or a battery, thereby decreasing competitiveness of a product.

SUMMARY

According to a first aspect of the present embodiment, a support frame for a bendable display screen includes: a fixed part; a bendable part connected with the fixed part; and an end part arranged at an end of the support frame. The bendable part includes a first bendable part and a second bendable part, the first bendable part includes a plurality of first frame members connected with one another, and the plurality of first frame members have a gap therebetween. The second bendable part is connected with the end part. Both the end part and the fixed part are provided with a limiting member.

According to a second aspect of the present disclosure, a bendable display screen includes: a flexible display screen; and a support frame for a bendable display screen. The support frame includes: a fixed part; a bendable part connected with the fixed part; and an end part arranged at an end of the support frame. The bendable part includes a first bendable part and a second bendable part, the first bendable part includes a plurality of first frame members connected with one another, and the plurality of first frame members have a gap therebetween. The second bendable part is connected with the end part. Both the end part and the fixed part are provided with a limiting member. The flexible display screen is arranged above and fixedly connected with the support frame.

It should be understood that both the foregoing general description and the following detailed description are example and explanatory only, and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the present disclosure. Instead, they are merely examples of apparatuses and methods consistent with aspects related to the present disclosure as recited in the appended claims.

A terminal may be implemented in various forms. For example, the terminal may include a mobile terminal such as a mobile phone, a tablet computer, a laptop, a navigation device, a wearable device, an intelligent bracelet, a pedometer. A support frame of a bendable display screen involved in various embodiments of the present disclosure may be applied to various terminals with a bendable screen, including but not limited to a mobile phone, an intelligent bracelet, an intelligent watch, etc. The following description will take the mobile terminal such as the mobile phone as an example. It should be understood by those skilled in the art that the configuration according to embodiments of the present disclosure may also be applied to a fixed terminal.

Figure 1:
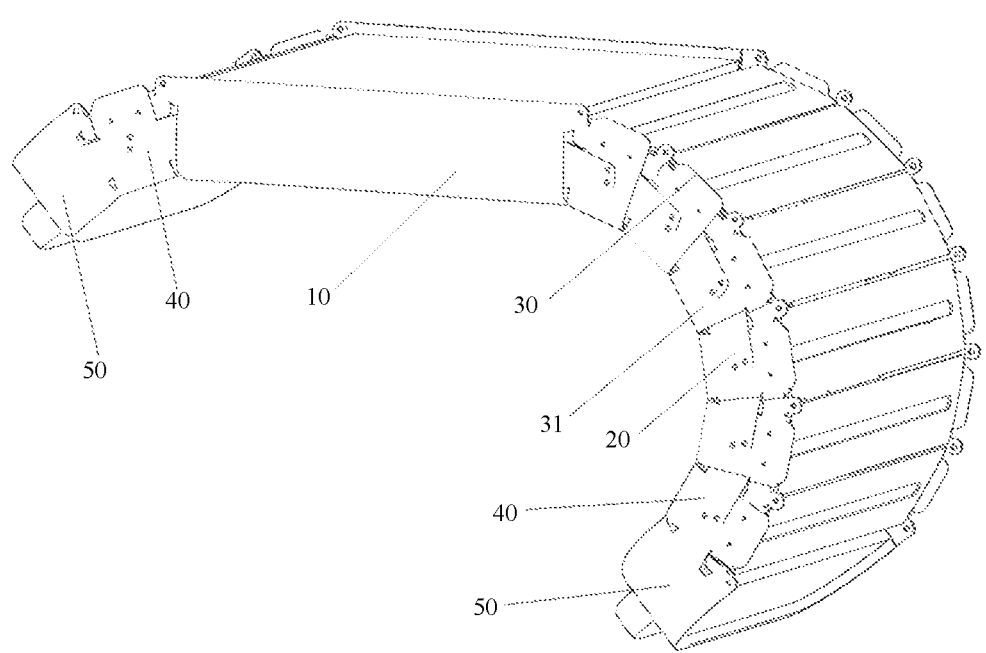
FIG. 1 is a schematic view of a support frame for a bendable display screen in a bent state according to an example embodiment.
Figure 2:
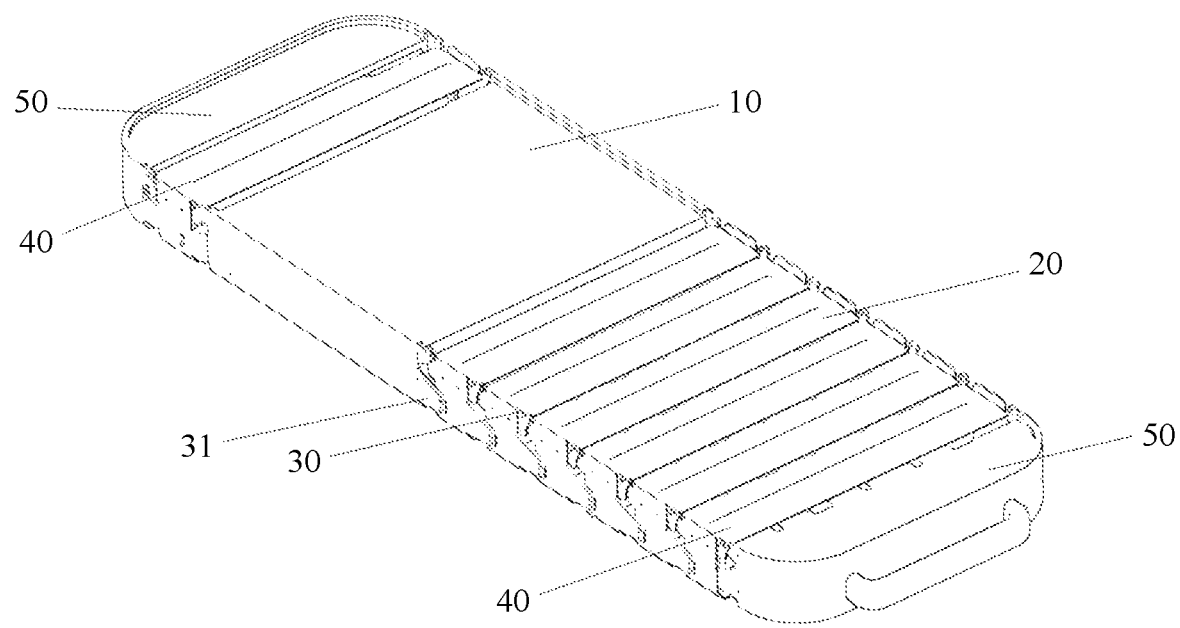
FIG. 2 is a schematic view of a support frame for a bendable display screen in an unbent state according to an example embodiment.

FIG. 1 is a schematic view of a support frame of a bendable display screen in a bent state according to an example embodiment. FIG. 2 is a schematic view of a support frame of a bendable display screen in an unbent state according to an example embodiment.

As illustrated in FIG. 1 and FIG. 2, a support frame of a bendable display screen includes a fixed part 10, a bendable part 20, and an end part 50. The bendable part 20 includes a first bendable part 30 and a second bendable part 40. The first bendable part 30 includes a plurality of first frame members 31 connected with one another.

A side of the fixed part 10 is connected with a side of the first bendable part 30 of the bendable part 20. The other side of the first bendable part 30 is connected with a side of the second bendable part 40. The other side of the second bendable part 40 is connected with the end part 50.

The other side of the fixed part 10 is connected with a side of another second bendable part 40. The other side of this second bendable part 40 is connected with another end part 50. That is, two second bendable parts 40 and two end parts 50 are provided. The fixed part 10 and the first bendable part 30 are arranged between the two second bendable parts 40. The two end parts 50 are connected with the two second bendable parts 40, respectively.

The plurality of first frame members 31 have gaps therebetween, such that the support frame for the bendable display screen is able to be mutually transformed between the bent state and unbent state. In order to achieve different bent degrees and states, the gaps between the first frame members 31 can be arranged to be different or identical.

Each of the end part 50 and the fixed part 10 is provided with a limiting member, and the limiting member is configured to lock the bent state of the bendable part 20 during bending thereof, thus facilitating to achieve the purpose of bending, and also preventing a structural loss caused by an excessive bending.

In the embodiment, a combination of a rigid support and a flexible deformation is achieved by the connection between the fixed part 10 and the bendable part 20, such that the purpose of bending is achieved and a certain rigidity can also be maintained by using the fixed part 10, and thus the bent state and the unbent state of the mobile terminal can be maintained stably. In addition, a battery in the mobile terminal needs to be securely mounted so as to maintain a good operation of the mobile terminal. Therefore, the fixed part 10 is also conducive to a fixation of a component of the mobile terminal, such as the battery.

Figure 3:
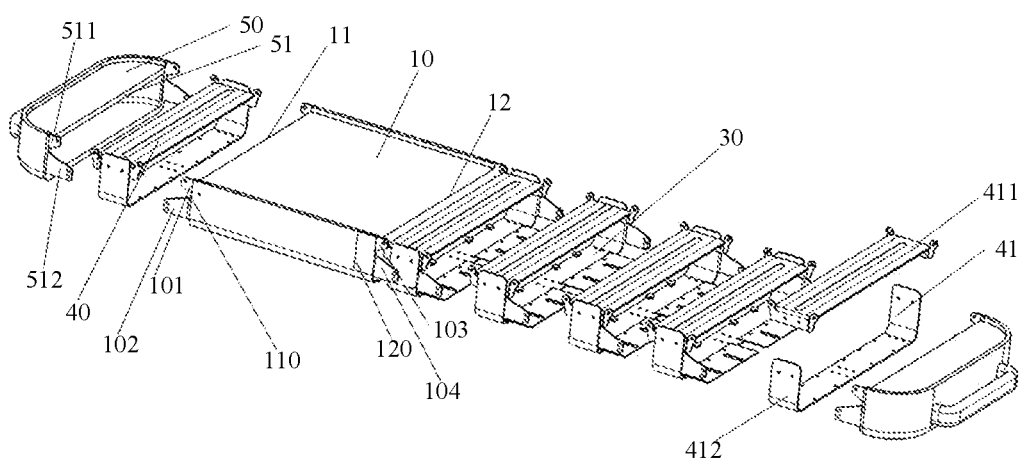
FIG. 3 is an exploded view of a support frame for a bendable display screen according to an example embodiment.

FIG. 3 is an exploded view of a support frame of a bendable display screen according to an example embodiment. As illustrated in FIG. 3, the fixed part 10 has a first connecting surface 11 and a second connecting surface 12 opposite to each other along a length direction of the support frame for the bendable display screen. The first connecting surface 11 is connected with the other second bendable part 40 and the second connecting surface 12 is connected with the first bendable part 30.

It should be noted that this embodiment only shows that one side of the fixed part 10 is connected with the first bendable part 30, while the other side thereof is connected with the other second bendable part 40, so as to achieve a relatively large bending at one side of the fixed part 10 and a relatively small bending at the other side thereof. However, in some embodiments, both sides of the fixed part 10 may be connected to the first bendable part 30, that is, two first bendable parts 30 are provided and the fixed part 10 is arranged between the two first bendable parts 30, so as to achieve a relatively large bending at both sides of the fixed part 10. In another embodiment, one side of the fixed part 10 is connected to the first bendable part 30, while the other side thereof is directly connected with the end part 50, so as to achieve the bending of the display screen at one side.

In an embodiment, the first connecting surface 11 is provided with first connecting portions 110 (one first connecting portion 110 being shown in FIG. 3) symmetrically arranged at both ends of the first connecting surface 11, and the first connecting portion 110 is arranged perpendicular to the first connecting surface 11. The first connecting portion 110 includes a first protrusion 101 and a second protrusion 102, and the first protrusion 101 is arranged above the second protrusion 102. Both the first protrusion 101 and the second protrusion 102 extend towards and are connected with the second bendable part 40. The first protrusion 101 and the second protrusion 102 are perpendicular to the first connecting surface 11. The second protrusion 102 is provided with a limiting member. The second protrusion 102 is connected with an outer surface of the second bendable part 40, and thus the second protrusion 102 protrudes outwards by a certain distance larger than a wall thickness of the second bendable part 40, that is, a distance between the second protrusions 102 at both ends of the first connecting surface 11 is larger than a width of the second bendable part 40, such that it is preferable to fitly accommodate the second bendable part 40 by the second protrusions 102 at both ends of the first connecting surface 11.

In an embodiment, the second connecting surface 12 is provided with second connecting portions 120 (one second connecting portion 120 being shown in FIG. 3) symmetrically arranged at both ends of the second connecting surface 12, and the second connecting portion 120 is arranged perpendicular to the second connecting surface 12. The second connecting portion 120 includes a third protrusion 103 and a fourth protrusion 104, and the third protrusion 103 is arranged above the fourth protrusion 104. Both the third protrusion 103 and the fourth protrusion 104 extend towards and are connected with the first bendable part 30. The third protrusion 103 and the fourth protrusion 104 are perpendicular to the second connecting surface 12. The fourth protrusion 104 is provided with a limiting member. The fourth protrusion 104 is connected with an outer surface of the first bendable part 30, and thus the fourth protrusion 104 protrudes outwards by a certain distance larger than a wall thickness of the first bendable part 30, that is, a distance between the fourth protrusions 104 at both ends of the second connecting surface 12 is larger than a width of the first bendable part 30, such that it is preferable to fitly accommodate the first bendable part 30 by the fourth protrusions 104 at both ends of the second connecting surface 12.

It should be noted that a plurality of first connecting portions may be arranged on the first connecting surface as required, and the positions of the plurality of first connecting portions are not limited to the two ends of the first connecting portion, while the plurality of first connecting portions can be located at any position of the first connecting surface as long as the corresponding purpose can be achieved. The support frame for the bendable display screen illustrated in the above embodiments is applied to a wearable mobile terminal. Therefore, in order to minimize the volume of the wearable mobile terminal, the first protrusion and the second protrusion are arranged perpendicular to the first connecting surface. In some embodiments, an angle between the first protrusion and the first connecting surface and an angle between the second protrusion and the first connecting surface may be arranged according to different specific application scenarios.

The second protrusion 102 is provided with the limiting member to lock the bent state of the other second bendable part 40 during the bending thereof, thus playing a certain role in connection, and maintaining the stability of the structure. The second protrusion 102 is arranged to be connected with the outer surface of the other second bendable part 40, and the second protrusion 102 protrudes outwards by a certain distance from its connection point with the first connecting surface 11. The protruded distance is larger than the wall thickness of the second bendable part 40, and it is preferable to fitly accommodate the second bendable part 40, so as to ensure an interconnection between the fixed part 10 and the second bendable part 40 and also a certain mobility therebetween. In some embodiments, the second protrusion may also be arranged to be connected with an inner surface of the other second bendable part 40.

Figure 4:
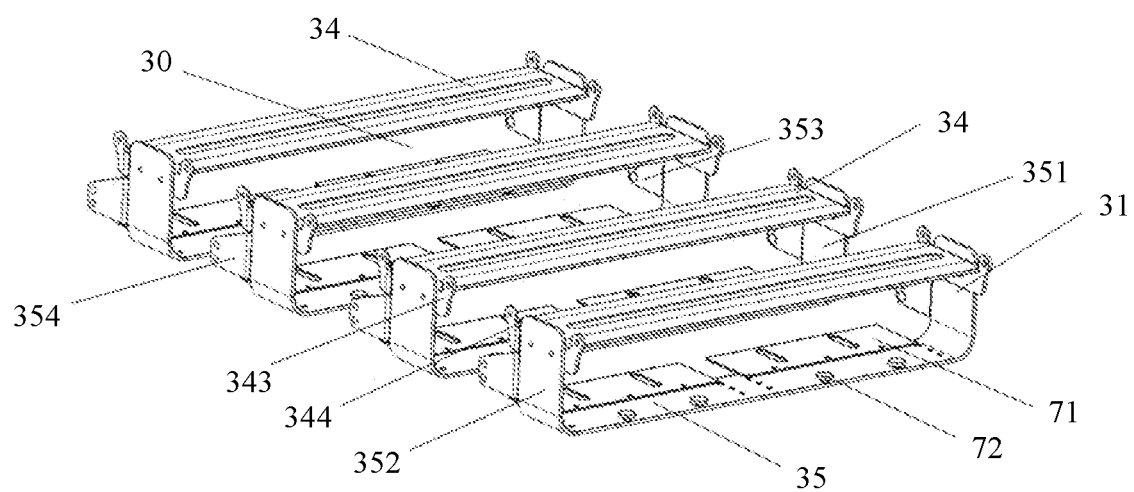
FIG. 4 is an exploded view of a first bendable part of a support frame for a bendable display screen according to an example embodiment.

FIG. 4 is a schematic view of a first bendable part of a support frame of a bendable display screen according to an example embodiment. As illustrated in FIG. 4, the first bendable part 30 includes a plurality of first frame members 31, and the first frame member 31 includes a first top plate 34 and a first bottom plate 35. The first top plate 34 is arranged above the first bottom plate 35. The first top plate 34 is provided with a first standing plate 341 (FIG. 5) and a second standing plate 342 (FIG. 5) opposite to each other along a width direction of the support frame for the bendable display screen. The first standing plate 341 and the second standing plate 342 are perpendicular to the first top plate 34.

The first top plate 34 is provided with a first connecting end 343 and a second connecting end 344 opposite to each other along the length direction of the support frame for the bendable display screen. The first connecting end 343 and the second connecting end 344 of two adjacent first top plates 34 are connected. That is, the first connecting end 343 of one of the two adjacent first top plates 34 is connected with the second connecting end 344 of the other one of the two adjacent first top plates 34. The first connecting end 343 and the second connecting end 344 are arranged to protrude from the first top plate 34, and extend along the length direction of the support frame for the bendable display screen.

Figure 5:
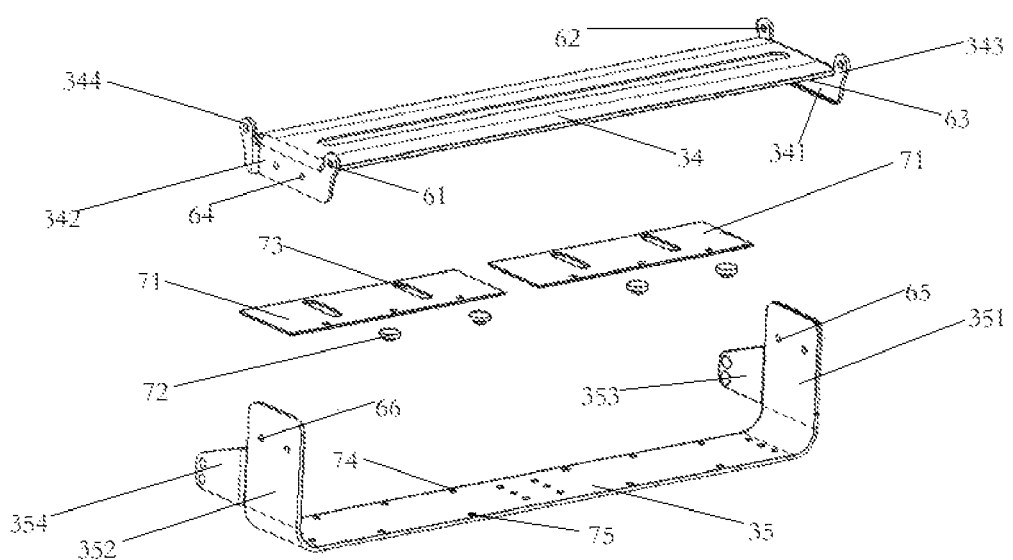
FIG. 5 is an exploded view of a first frame member of a support frame for a bendable display screen according to an example embodiment.

FIG. 5 is a schematic view of a first frame member of a support frame of a bendable display screen according to an example embodiment. As illustrated in FIGS. 4 and 5, two first connecting ends 343 are provided to the first standing plate 341 and the second standing plate 342 on both sides of the first top plate 34 in the width direction of the support frame, respectively, and correspondingly arranged in a same manner. Similarly, two second connecting ends 344 are also provided to the first standing plate 341 and the second standing plate 342 on both sides of the first top plate 34 in the width direction of the support frame, respectively, and correspondingly arranged in a same manner. The first connecting end 343 and the second connecting end 344 on the first standing plate 341 or the second standing plate 343 are opposite to each other. The first connecting end 343 and the second connecting end 344 are arranged to protrude from the first standing plate 341 or the second standing plate 342, and extend along the length direction of the support frame for the bendable display screen. Such an arrangement will not increase a thickness of the support frame for the bendable display screen, but can meet a requirement for a lightweight and portable mobile terminal, and also ensure the stable connection of the plurality of first frame members while the gap exists between the plurality of first frame members.

As further illustrated in FIG. 5, the first connecting end 343 is provided with a first hole 61 therein, the second connecting end 344 is provided with a second hole 62 therein, the first connecting end 343 and the second connecting end 344 of the two adjacent first top plates 34 overlap each other, i.e. the first connecting end 343 of one of the two adjacent first top plates 34 overlaps the second connecting end 344 of the other one of the two adjacent first top plates 34, such that the first hole 61 overlaps the second hole 62. Thus, a pin passes through the first hole 61 and the second hole 62 overlapping each other to achieve the effect of connection. In order to achieve the overlapping effect, there may be a connection manner in which the first connecting end 343 is arranged at an outer surface of the second connecting end 344, or there may be a connection manner in which the second connecting end 344 is arranged at an outer surface of the first connecting end 343. In this embodiment, the first connecting end 343 is arranged at the outer surface of the second connecting end 344, such that the first connecting end 343 protrudes outwards by a certain distance larger than a thickness of the second connecting end 344, and thus it is preferable to fitly accommodate the second connecting end 344 and also to allow the same to move. That is, the second connecting ends 344 of one of the two adjacent first top plates 34 are accommodated between the first connecting ends 343 of the other one of the two adjacent first top plates 34.

It should be noted that, in this embodiment, since the connection manner of the pin, the first hole and the second hole occupies a small internal space and has a certain mobility, this connection manner is suitable to meet the technical characteristic requirements for the arrangement and placement of various electronic components in the wearable mobile terminal. However, in other embodiments, the first connecting end and the second connecting end may also be connected through other movable connection manners, for example, through a rotating shaft, as long as the corresponding purpose can be achieved.

As further illustrated in FIG. 5, the first bottom plate 35 is provided with a first vertical plate 351 and a second vertical plate 352 opposite to each other along the width direction of the support frame for the bendable display screen. The first vertical plate 351 is provided with a first projection portion 353 along the length direction of the support frame for the bendable display screen, and the first projection portion 353 connects two adjacent first vertical plates 351 with each other. The second vertical plate 352 is provided with a second projection portion 354 along the length direction of the support frame for the bendable display screen, and the second projection portion 354 connects two adjacent second vertical plates 352 with each other.

As illustrated in FIG. 4, the first projection portion 353 is connected with an outer surface of the adjacent first vertical plate 351, that is, the first projection portion 353 of one of two adjacent first vertical plates 351 is connected with the outer surface of the other one of the two adjacent first vertical plates 351. The first projection portion 353 needs to protrude outwards by a certain distance larger than a thickness of the first vertical plate 351, and it is preferable to fitly accommodate the first vertical plate 351 of the first bottom plate 35 by the first projection portion 353 of the adjacent first bottom plate 35, so as to ensure the connectivity and mobility between the first vertical plates 351 of the adjacent bottom plates 35. Accordingly, the second projection portion 354 is connected with an outer surface of the adjacent second vertical plate 352, that is, the second projection portion 354 of one of two adjacent second vertical plates 352 is connected with the outer surface of the other one of the two adjacent second vertical plates 352. The second projection portion 354 protrudes outwards by a certain distance larger than a thickness of the second vertical plate 352, and it is preferable to fitly accommodate the second vertical plate 352 of the first bottom plate 51 by the second projection portion 354 of the adjacent first bottom plate 35, so as to ensure the connectivity and mobility between the second vertical plates 352 of the adjacent bottom plates 35. That is, the first vertical plate 351 and the second vertical plate 352 of the first bottom plate 35 are fitly accommodated between the first projection portion 353 and the second projection portion 354 of the adjacent first bottom plate 35. Furthermore, both the first projection portion 353 and the second projection portion 354 are provided with a limiting member.

As illustrated in FIG. 5, the first standing plate 341 has two third holes 63 arranged between the first connecting end 343 and the second connecting end 344, and the second standing plate 342 has two fourth holes 64 arranged between the first connecting end 343 and the second connecting end 344. Two fifth holes 65 are arranged in the first vertical plate 351, and two sixth holes 66 are arranged in the second vertical plate 352. The two third holes 63 overlap and are connected with the two fifth holes 65 via a pin, respectively, and the two fourth holes 64 overlap and are connected with the two sixth holes 66 via a pin, respectively. In other possible embodiments, other connection manners may be adopted.

The first bendable part 30 is also provided with a shielding member for a space compensation when the first bendable part 30 is bent. Since the support frame for the bendable display screen has the bent state and the unbent state, the surface of the first bendable part 30 is shrunk or stretched during bending or unbending, and the shielding member is arranged to play a role of the space compensation during the above process.

In the present disclosure, according to the bending characteristics of the support frame for the bendable display screen, the shielding member may be arranged at different positions. For example, when the support frame for the bendable display screen is of a stretch type, the shielding member may be arranged to the outer surface of the support frame for the bendable display screen, so as to shield the space exposed out of the outer surface during bending, such that a size of the inner surface of the support frame of the display screen remains unchanged, and the outer surface thereof may be increased within a certain range. When the support frame for the bendable display screen is a compressible bendable assembly, the shielding member may be arranged to the inner surface of the support frame of the bending display screen, so as to shield the space exposed out of the inner surface during unbending, such that a size of the outer surface of the support frame of the display screen remains unchanged, and the inner surface thereof may be reduced within a certain range.

As illustrated in FIG. 4 and FIG. 5, the first bottom plate 35 is provided with the shielding member. The shielding member illustrated in this embodiment includes a shielding sheet 71 and a guide pin 72, both of which are arranged on an inner surface of the first bottom plate 35. The shielding sheet 71 includes a long-strip hole 73 therein. The shielding sheet 71 is arranged on one side of the first bottom plate 35, and the guide pin 72 is arranged on the other side of the first bottom plate 35. The guide pin 72 and the shielding sheet 71 of two adjacent first bottom plates 35 are connected through the long-strip hole 73 of the shielding sheet 71. That is, the shielding sheet 71 of one of the two adjacent first bottom plates 35 is connected with the guide pin 72 of the other one of the two adjacent first bottom plates 35 through the long-strip hole 73 of the shielding sheet 71.

As illustrated in FIG. 4 and FIG. 5, a gap exists between two adjacent first bottom plates 35. One or more shielding sheets 71 may be provided, mainly for shielding the gap between the two adjacent first bottom plates. Thus, a width of the shielding sheet 71 is larger than the gap between the first bottom plates 35.

In the embodiment, each first bottom plate 35 is provided with two shielding sheets 71, and each shielding sheet 71 is provided with two long-strip holes 73 therein. A width of the long-strip hole 73 is configured in such a manner that the long-strip hole 73 fitly accommodates the guide pin 72 and guides the guide pin 72 to slide. The number of the long-strip holes 73 is equal to the number of the guide pins 72, and the long-strip holes 73 have a one to one correspondence with the guide pins 72. Therefore, each first bottom plate 35 in this embodiment is provided with four guide pins 72. In other possible embodiments, the numbers of the shielding sheets, the long-strip holes and the guide pins may be arranged as required.

The shielding sheet 71 and the guide pin 72 on the two adjacent first bottom plates 35 are connected. The shielding sheet 71 is fixed to the first bottom plate 35 through three first fixing points 74, and is arranged to partially overlap the first bottom plate 35 to which the shielding sheet 71 is fixed. The guide pin 72 is fixed to the first bottom plate 35 through a fixing point 75, and is arranged to slide in the long-strip hole on the shielding sheet 71. The long-strip hole is arranged to partially overlap the first bottom plate 35 to which it is fixed. When the guide pin 72 is located at an end of the long-strip hole overlapping the first bottom plate 35, the shielding sheet 71 is located inside the first frame member 31, and the support frame for the bendable display screen is in the bent state (as illustrated in FIG. 1). When the guide pin 72 slides in the long-strip hole from the end overlapping the first bottom plate 35 to the other end, the shielding sheet 71 is located at the bottom surface of the first frame member 31, and the support frame for the bendable display screen is in the unbent state (as illustrated in FIG. 2).

It should be noted that the shielding member may also be configured as other structures that can play the role of the space compensation, as long as the purpose can be achieved. The manner adopted in the present disclosure is to arrange the shielding sheet and the guide pin on the inner surface of the first bottom plate, such that the existing gap is compensated when the bendable part is in the unbent state, and the shielding sheet is completely hidden at the inner side of the first bottom plate when the bendable part is bent to the maximum angle, thus achieving the shielding effect without affecting the bent angle of the support frame for the bendable display screen.

In an embodiment, as illustrated in FIG. 3, the second bendable part 40 includes a plurality of second frame members 41, and the second frame member 41 includes a second top plate 411 and a second bottom plate 412. The second top plate 411 is arranged above the second bottom plate 412 and is connected with the second bottom plate 412. The second bendable part 40 is mainly configured to be connected with the end part 50. One side of the second bendable part 40 is connected with the end part 50, and the other side thereof may be connected with the first bendable part 30 or the fixed part 10. Considering the consistency of the structures and the convenience of connection, the shape and size of the second frame member 41 are consistent with those of the first frame member 31 in this embodiment. The shape and size of the second top plate 411 are consistent with those of the first top plate 34, and the shape and size of the second bottom plate 412 are also consistent with those of the second bottom plate 35. The connection manner of the second top plate 411 and the first top plate 34 is consistent with that of the two adjacent first top plates 34.

In an embodiment, as illustrated in FIG. 3, the end parts 50 are arranged at both ends of the support frame for the bendable display screen in this embodiment. In some embodiments, the end parts 50 may be arranged symmetrically at both ends of the support frame for the bendable display screen. In other embodiments, there may be a case that only one end of the support frame for the bendable display screen is provided with the end part. The end part 50 is mainly configured to enclose the end of the support frame for the bendable display screen, maintain the integrity of the structure and protect the internal electronic components. Therefore, the end part 50 has a third connecting surface 51 only at a side of the end part 50 connected with the second bendable part 40, and the third connecting surface 51 includes a fifth protrusion 511 and a sixth protrusion 512. The fifth protrusion 511 is connected to an inner surface of the second bendable part 40, such that the fifth protrusion 511 protrudes inwards by a certain distance larger than the wall thickness of the second bendable part 40, and it is preferable to fitly support the second bendable part 40. In some embodiments, the first protrusion 101 and the third protrusion 103 may be configured and connected with the first bendable part 30 or the second bendable part 40 in a similar manner.

In addition, the end part 50 is also provided with a limiting member, and the limiting member is arranged on the fifth protrusion 511 and the sixth protrusion 512.

For example, the limiting member may be a damping generator. The arrangement of the limiting member is to achieve a stepless adjustment of the support frame for the bendable display screen during bending and unbending. That is, a self-lock can be achieved at any angle within an allowable range, and also a hand feeling of a user in operation during bending or unbending can be enhanced, thus improving the user experience.

In the present disclosure, when the support frame for the bendable display screen is applied to the mobile terminal, a plurality of electronic components may need to be mounted. In order to meet the technical characteristic requirements for the arrangement and placement of the electronic components, the surfaces of the first top plate and the first bottom plate as well as the second top plate and the second bottom plate may be provided with or not be provided with openings of various shapes and sizes.

In the present disclosure, the support frame for the bendable display screen can be maintained in different bent states, thus facilitating to achieve various use purposes of the mobile terminal and hence improve the competitiveness of the mobile terminal. Moreover, the support frame for the bendable display screen usually needs to be connected with a display screen when applied to the mobile terminal. During the bending of the support frame for the bendable display screen, a distance between a resulted rotating arc surface and a support surface of the display screen is adjustable, so as to optimize and adjust the support frame for the bendable display screen according to the thickness specificity of different display screens, thus releasing a shear stress generated during bending.

The present disclosure also provides a bendable display screen, including a flexible display screen and the support frame for the bendable display screen described above. The flexible display screen is arranged above and fixedly connected with the support frame for the bendable display screen. The flexible display screen is configured such that at least a part of the flexible display screen connected with the bendable part is bendable. The flexible display screen is a display screen that is bendable (i.e. capable of achieving the purpose of being bent), or at least the part of the flexible display screen connected with the bendable part is bendable, while it is not limited whether other parts of the flexible display screen are bendable, as long as the screen is bendable as a whole.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as example only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A support frame for a bendable display screen, comprising:
   a fixed part;
   a bendable part connected with the fixed part; and
   an end part located at an end of the support frame,
   wherein the bendable part comprises a first bendable part and a second bendable part, the first bendable part comprises a plurality of first frame members connected with one another, the plurality of first frame members have a gap therebetween, and
   the second bendable part is connected with the end part,
   wherein the first frame member comprises a first top plate and a first bottom plate,
   the first top plate is arranged above the first bottom plate,
   the first top plate is provided with a first standing plate and a second standing plate opposite to each other along a width direction of the support frame, and
   the first standing plate and the second standing plate are perpendicular to the first top plate and connected with the first top plate,
   wherein the first bottom plate is provided with a first vertical plate and a second vertical plate opposite to each other along the width direction of the support frame,
   the first vertical plate is connected to the first standing plate, and
   the second vertical plate is connected to the second standing plate,
   wherein the first vertical plate has a first projection portion along a length direction of the support frame, the first projection portion abuts against another adjacent first vertical plate, and
   the second vertical plate has a second projection portion along the length direction of the support frame, the second projection portion abuts against another adjacent second vertical plate.

2. The support frame for the bendable display screen according to claim 1, wherein the bendable part is arranged at both sides of the fixed part.

3. The support frame for the bendable display screen according to claim 1, wherein the first bendable part is provided with a shielding member for shielding the gap between the plurality of first frame members.

4. The support frame for the bendable display screen according to claim 1, wherein the fixed part has a first connecting surface and a second connecting surface opposite to each other along the length direction of the support frame, the first connecting surface is connected with the second bendable part.

5. The support frame for the bendable display screen according to claim 4, wherein the second connecting surface is connected with the first bendable part.

6. The support frame for the bendable display screen according to claim 4, wherein the first connecting surface is provided with a first connecting portion, the second connecting surface is provided with a second connecting portion.

7. The support frame for the bendable display screen according to claim 1, wherein the first top plate has a first connecting end and a second connecting end opposite to each other along a length direction of the support frame, the first connecting end of the first top plate is connected with a second connecting end of another adjacent first top plate.

8. The support frame for the bendable display screen according to claim 7, wherein the first connecting end and the second connecting end of the first top plate protrude from the first top plate, and extend along the length direction of the support frame.

9. The support frame for the bendable display screen according to claim 1, wherein the first bottom plate is provided with a shielding member thereon.

10. The support frame for the bendable display screen according to claim 9, wherein the shielding member comprises:
a shielding sheet having a long-strip hole; and
a guide pin fitted in the long-strip hole and configured to connect the shielding sheet between two adjacent first bottom plates.

11. The support frame for the bendable display screen according to claim 10, wherein the two adjacent first bottom plates have the gap therebetween, the shielding sheet has a width configured to cover the gap between the two adjacent first bottom plates.

12. The support frame for the bendable display screen according to claim 1, wherein the second bendable part comprises a plurality of second frame members, a second frame member of the plurality of second frame members comprises a second top plate and a second bottom plate, and
the second top plate is arranged above the second bottom plate and is connected with the second bottom plate.

13. A bendable display screen, comprising:
a flexible display screen; and
a support frame for the bendable display screen, the support frame comprising:
a fixed part;
a bendable part connected with the fixed part; and
an end part located at an end of the support frame,
wherein the bendable part comprises a first bendable part and a second bendable part, the first bendable part comprises a plurality of first frame members connected with one another, the plurality of first frame members have a gap therebetween, and
the second bendable part is connected with the end part,
wherein the flexible display screen is arranged above and fixedly connected with the support frame,
the first frame member comprises a first top plate and a first bottom plate,
the first top plate is arranged above the first bottom plate,
the first top plate is provided with a first standing plate and a second standing plate opposite to each other along a width direction of the support frame, and
the first standing plate and the second standing plate are perpendicular to the first top plate and connected with the first top plate,
wherein the first bottom plate is provided with a first vertical plate and a second vertical plate opposite to each other along the width direction of the support frame,
the first vertical plate is connected to the first standing plate, and
the second vertical plate is connected to the second standing plate,
wherein the first vertical plate has a first projection portion along a length direction of the support frame, the first projection portion abuts against another adjacent first vertical plate, and
the second vertical plate has a second projection portion along the length direction of the support frame, the second projection portion abuts against another adjacent second vertical plate.

14. The bendable display screen according to claim 13, wherein at least part of the flexible display screen is bendable and connected with the bendable part.

* * * * *